US008854881B2

(12) United States Patent
Chevallier et al.

(10) Patent No.: US 8,854,881 B2
(45) Date of Patent: *Oct. 7, 2014

(54) CIRCUITS AND TECHNIQUES TO COMPENSATE MEMORY ACCESS SIGNALS FOR VARIATIONS OF PARAMETERS IN MULTIPLE LAYERS OF MEMORY

(71) Applicant: Unity Semiconductor Corporation, Sunnyvale, CA (US)

(72) Inventors: Christophe Chevallier, Palo Alto, CA (US); Seow Fong Lim, Fremont, CA (US); Chang Hua Siau, Saratoga, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/858,482

(22) Filed: Apr. 8, 2013

(65) Prior Publication Data

US 2013/0229856 A1 Sep. 5, 2013

Related U.S. Application Data

(63) Continuation of application No. 12/931,438, filed on Feb. 1, 2011, now Pat. No. 8,427,868.

(60) Provisional application No. 61/337,706, filed on Feb. 3, 2010, provisional application No. 61/337,299, filed on Feb. 1, 2010.

(51) Int. Cl.
| | |
|---|---|
| *G11C 11/34* | (2006.01) |
| *G11C 13/00* | (2006.01) |
| *G11C 7/22* | (2006.01) |
| *G11C 5/02* | (2006.01) |
| *G11C 11/21* | (2006.01) |
| *B82Y 30/00* | (2011.01) |

(52) U.S. Cl.
CPC .............. *G11C 7/22* (2013.01); *G11C 13/0021* (2013.01); *B82Y 30/00* (2013.01); *G11C 5/02* (2013.01); *G11C 11/21* (2013.01)
USPC ............ 365/185.03; 365/185.05; 365/185.11; 365/185.19; 365/185.29; 365/185.33

(58) Field of Classification Search
USPC ............. 365/185.03, 185.05, 185.11, 185.19, 365/185.29, 185.33, 148, 185.1
See application file for complete search history.

(56) References Cited

U.S. PATENT DOCUMENTS

| 6,836,421 B2 | 12/2004 | Rinerson et al. |
| 6,859,382 B2 | 2/2005 | Rinerson et al. |

(Continued)

OTHER PUBLICATIONS

Patent Application Publication US 2013/0135920 A1 (U.S. Appl. No. 13/658,697).*

(Continued)

*Primary Examiner* — Trong Phan
(74) *Attorney, Agent, or Firm* — Stolowitz Ford Cowger LLP

(57) ABSTRACT

Embodiments of the invention relate generally to semiconductors and memory technology, and more particularly, to systems, integrated circuits, and methods to implement circuits configured to compensate for parameter variations in layers of memory by adjusting access signals during memory operations. In some embodiments, memory cells are based on third dimensional memory technology. In at least some embodiments, an integrated circuit includes multiple layers of memory, a layer including sub-layers of semiconductor material. The integrated circuit also includes an access signal generator configured to generate an access signal to facilitate an access operation, and a characteristic adjuster configured to adjust the access signal for each layer in the multiple layers of memory.

19 Claims, 6 Drawing Sheets

(56) References Cited

U.S. PATENT DOCUMENTS

| | | | |
|---|---|---|---|
| 6,970,391 | B2 | 11/2005 | Watanabe et al. |
| 6,999,339 | B2 | 2/2006 | Tuttle et al. |
| 7,009,909 | B2 | 3/2006 | Rinerson et al. |
| 7,057,914 | B2 | 6/2006 | Rinerson et al. |
| 7,079,442 | B2 | 7/2006 | Rinerson et al. |
| 7,149,107 | B2 | 12/2006 | Rinerson et al. |
| 7,227,774 | B2 | 6/2007 | Tuttle et al. |
| 7,227,775 | B2 | 6/2007 | Rinerson et al. |
| 7,327,753 | B2 | 2/2008 | Raissinia et al. |
| 7,379,364 | B2 | 5/2008 | Siau et al. |
| 7,508,695 | B2 | 3/2009 | Sugita |
| 7,538,338 | B2 | 5/2009 | Rinerson et al. |
| 7,701,791 | B2 | 4/2010 | Rinerson et al. |
| 7,719,876 | B2 | 5/2010 | Chevallie et al. |
| 7,796,451 | B2 | 9/2010 | Norman |
| 7,830,701 | B2 | 11/2010 | Siau et al. |
| 7,884,349 | B2 | 2/2011 | Rinerson et al. |
| 7,897,951 | B2 | 3/2011 | Rinerson et al. |
| 8,040,723 | B2 | 10/2011 | Sheu et al. |
| 8,050,084 | B2 | 11/2011 | Bae et al. |
| 8,064,256 | B2 | 11/2011 | Norman |
| 8,111,572 | B2 * | 2/2012 | Norman .............. 365/185.1 |
| 8,134,866 | B2 | 3/2012 | Bae et al. |
| 8,139,409 | B2 * | 3/2012 | Chevallier et al. ....... 365/185.05 |
| 8,164,937 | B2 | 4/2012 | Norman |
| 8,164,970 | B2 | 4/2012 | Norman |
| 8,270,193 | B2 | 9/2012 | Siau et al. |
| 8,305,796 | B2 * | 11/2012 | Chevallier et al. ............ 365/148 |
| 8,363,443 | B2 * | 1/2013 | Chevallier et al. ............ 365/148 |
| 8,559,209 | B2 * | 10/2013 | Siau ............................ 365/148 |
| 2006/0171200 | A1 | 8/2006 | Rinerson et al. |
| 2009/0027976 | A1 | 1/2009 | Rinerson et al. |
| 2009/0154232 | A1 | 6/2009 | Norman |
| 2010/0157647 | A1 | 6/2010 | Rinerson et al. |
| 2010/0157670 | A1 | 6/2010 | Chevallier et al. |
| 2010/0159641 | A1 | 6/2010 | Rinerson et al. |
| 2010/0159688 | A1 | 6/2010 | Rinerson et al. |
| 2010/0232240 | A1 | 9/2010 | Norman |
| 2010/0290294 | A1 | 11/2010 | Siau |
| 2011/0188281 | A1 | 8/2011 | Siau et al. |
| 2011/0188282 | A1 | 8/2011 | Chevallier et al. |
| 2011/0188283 | A1 | 8/2011 | Chevallier et al. |
| 2011/0188284 | A1 | 8/2011 | Chevallier et al. |

OTHER PUBLICATIONS

Patent Application Publication US 2013/0215667 A1 (U.S. Appl. No. 13/728,676).*

Chevallier, Christophe, et al., U.S. Appl. No. 12/657,895, filed Jan. 29, 2010, re Filed Application with Figures. 41 pages.

Chevallier, Christophe, et al., U.S. Appl. No. 12/658,138, filed Feb. 2, 2010, re Filed Application with Figures. 34 pages.

Chevallier, Christophe, et al., U.S. Appl. No. 12/931,422, filed Jan. 31, 2011, re Filed Application and Figures. 51 pages.

Chevallier, Christophe, et al., U.S. Appl. No. 12/931,438, filed Feb. 1, 2011, re Filed Application with Figures. 34 pages.

Siau, Chang Hua, et al., U.S. Appl. No. 12/657,911, filed Jan. 29, 2010, re Filed Application with Figures. 54 pages.

* cited by examiner

CIRCUITS AND TECHNIQUES TO COMPENSATE MEMORY ACCESS SIGNALS FOR VARIATIONS OF PARAMETERS IN MULTIPLE LAYERS OF MEMORY

CROSS-REFERENCE TO RELATED APPLICATIONS

This application is a continuation of and claims priority to U.S. patent application Ser. No. 12/931,438, filed Feb. 1, 2011, issued as U.S. Pat. No. 8,427,868, which is a non-provisional of and claims priority to U.S. Provisional Patent Application, 61/337,706, filed Feb. 3, 2010, and U.S. Provisional Patent Application 61/337,299, filed Feb. 1, 2010, each of which is incorporated herein by reference in its entirety. This application is related to U.S. patent application Ser. No. 11/095,026, filed Mar. 30, 2005, published as U.S. Publication 2006/0171200, and entitled "Memory Using Mixed Valence Conductive Oxides," which is incorporated herein by reference.

FIELD OF THE INVENTION

Embodiments of the invention relate generally to semiconductors and memory technology, and more particularly, to systems, integrated circuits, and methods to implement circuits configured to compensate for parameter variations in layers of memory by adjusting access signals during memory operations.

BACKGROUND

Variations in semiconductor wafer processing typically introduce defects and unpredictable parametric variations (e.g., excessive current draw) into traditional memory technologies. Such variations generally affect the reliability of memory devices. Some conventional memory architectures include circuitry to improve reliability of memory devices over fluctuations in process. In one approach, programmable circuitry is used to reduce the effects of process variations on memory operations in conventional memory technologies, which includes transistor or gated-based memories (e.g., DRAM, Flash, etc.). While such circuitry is functional, the conventional techniques of reducing the effects of process variations are not well suited for advanced memory technologies. For example, in conventional memory architectures, the memory cells are formed in a single plane, which inherently provides for a uniform formation of semiconductor structures over a two-dimensional plane. Thus, the common techniques for improving program, read and erase operations in connection with conventional memory cells are not well-suited for fine-tuning memory operations in other memory technologies.

It would be desirable to provide improved systems, integrated circuits, and methods that minimize one or more of the drawbacks associated with conventional memory architectures to compensate for parameter variations associated with the operation of memory cells, for example, in a cross-point memory array with multiple layers of memory.

BRIEF DESCRIPTION OF THE DRAWINGS

The various embodiments are more fully appreciated in connection with the following detailed description taken in conjunction with the accompanying drawings, in which.

Figure 1:
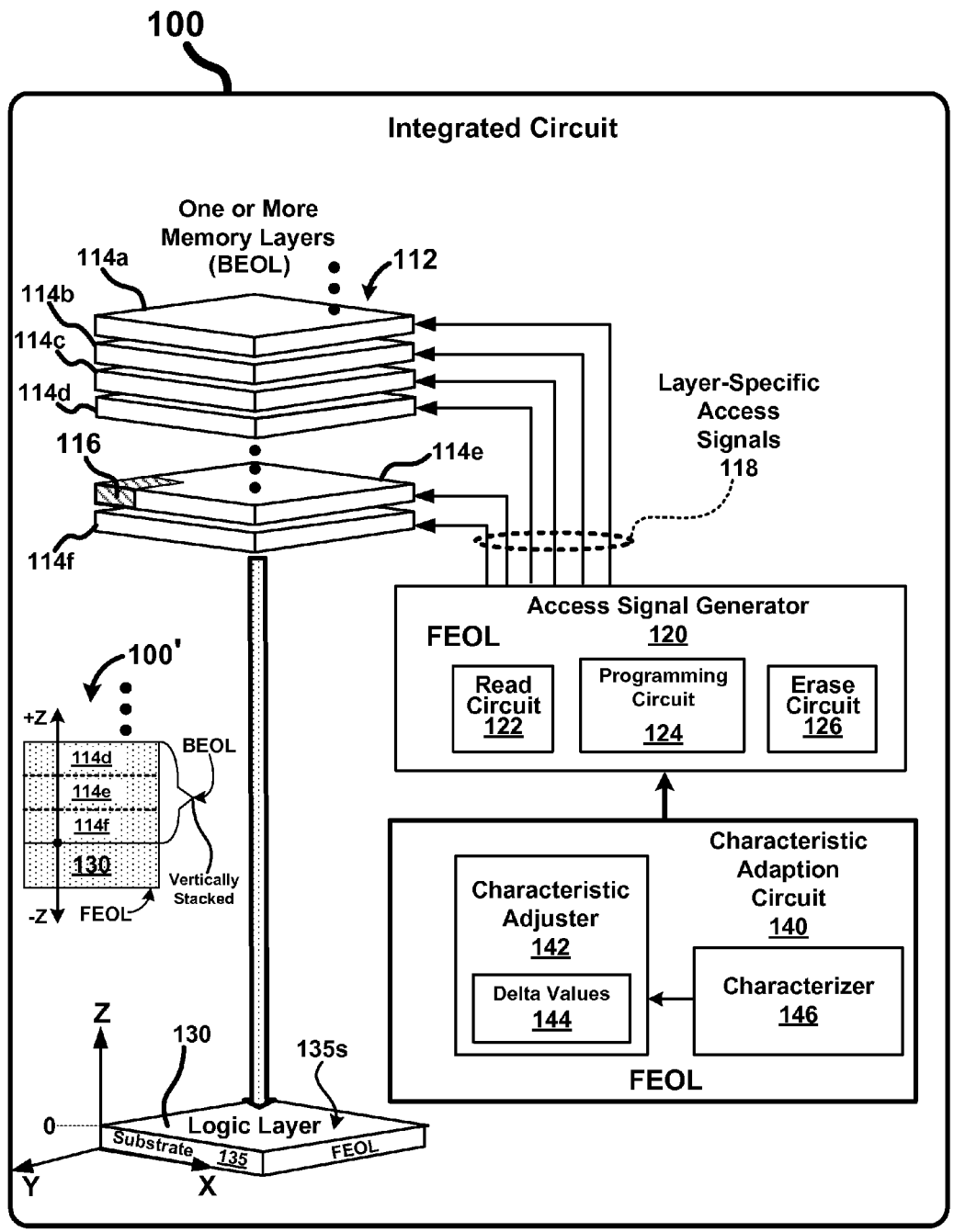
FIG. 1 illustrates an example of an integrated circuit including memory and a characteristic adjuster that facilitates generation of layer-specific access signals, according to various embodiments.

Like reference numerals refer to corresponding parts throughout the several views of the drawings. Note that most of the reference numerals include one or two left-most digits that generally identify the figure that first introduces that reference number. Furthermore, the depictions in the drawings are not necessarily to scale.

DETAILED DESCRIPTION

Various embodiments or examples of the invention may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

U.S. patent application Ser. No. 11/095,026, filed Mar. 30, 2005, published as U.S. Pub. No. 2006/0171200, and entitled "Memory Using Mixed Valence Conductive Oxides," is hereby incorporated by reference in its entirety for all purposes and describes non-volatile third dimensional memory elements that may be arranged in a two-terminal cross-point memory array. New non-flash re-writeable non-volatile memory structures are possible with the capability of this third dimensional memory array. In at least some embodiments, a two-terminal memory element or memory cell can be configured to change conductivity when exposed to an appropriate voltage drop across its two-terminals. The memory element can include an electrolytic tunnel barrier in contact with and electrically in series with a mixed valence conductive oxide that includes mobile oxygen ions in some embodiments, as well as multiple layers of mixed valence conductive oxide structures in other embodiments. The electrolytic tunnel barrier comprises an electronically insulating material that is thin enough to promote electron tunneling during data operations on the memory element (e.g., read and write operations) while also promoting a high electric field during write operations operable to cause the mobile oxygen ions to be transported into or out of the electrolytic tunnel barrier depending on the direction of the electric field within the memory element. The direction of the electric field is determined by the polarity of the write voltage. Therefore, the electrolytic tunnel barrier is permeable to the mobile oxygen ions and is operative as an electrolyte to the mobile oxygen ions. The mobile oxygen ions are transported between the electrolytic tunnel barrier and the mixed valence conductive oxide in response to an electric field generated by the application of the write voltage across the electrolytic tunnel barrier and the mixed valence conductive oxide. Examples of conductive metal oxides suitable for use as the mixed valence conductive oxide includes but is not limited to perovskites and binary oxides (e.g., a conductive binary oxide). Application of a write voltage across the memory element is operative to create a voltage drop across the electrolytic tunnel barrier that generates a higher electric field within the electrolytic tunnel barrier that is operative to transport a portion of the mobile oxygen ions in the mixed valence conductive oxide into the electrolytic tunnel barrier for a first polarity of the write voltage and to transport the portion of portion of the mobile oxygen ions in the electrolytic tunnel barrier back into the mixed valence conductive oxide for a second polarity of the write voltage, the second polarity is opposite the first polarity.

In some embodiments, an electrolytic tunnel barrier and one or more mixed valence conductive oxide structures do not need to operate in a silicon substrate (e.g., a silicon die or silicon wafer), and, therefore, can be fabricated back-end-of-the-line (BEOL) directly above circuitry fabricated front-end-of-the-line (FEOL) on the semiconductor substrate and being used for other purposes. Further, a two-terminal memory element can be configured in a cross-point such that one terminal of the memory element is electrically coupled with an X-direction line (or an "X-line") and the other terminal of the memory element is electrically coupled with a Y-direction line (or a "Y-line"). A discrete two-terminal memory element is one in which the two terminals of the memory element are directly electrically coupled with the conductive array lines (e.g., X-line and Y-line or a Word-line and Bit-line) at its respective cross-point without any intervening structure such as a selection device, also known as a non-ohmic device (NOD). Therefore, a discrete two-terminal memory element is one that is directly electrically in series with its respective conductive array lines. Examples of a selection devices/NOD include metal-insulator-metal (MIM) devices or one or more diodes that comprise an intervening structure that is electrically in series with the memory element and with the conductive array lines. Unless otherwise specified herein, all references to a memory element or memory cell is a reference to a discrete memory element or discrete memory cell that does not include a selection device or NOD. A third dimensional memory can include multiple memory layers that are vertically stacked upon one another, with memory elements in a memory layer that sometimes share X-direction and Y-direction lines with memory elements in adjacent memory layers. In other embodiments, the memory elements in each memory layer have electrically isolated conductive array lines and do not share conductive array lines with memory elements in adjacent memory layers. When a first write voltage, VW1, is applied across the memory element (e.g., by applying ½VW1 to the X-direction line and ½-VW1 to the Y-direction line), the memory element can switch to a low resistive state. When a second write voltage, VW2, is applied across the memory element (e.g., by applying ½ VW2 to the X-direction line and ½-VW2 to the Y-direction line), the memory element can switch to a high resistive state. Memory elements using electrolytic tunnel barriers and mixed valence conductive oxides can have VW1 opposite in polarity from VW2.

FIG. 1 depicts an example of an integrated circuit including memory and a characteristic adjuster that facilitates generation of layer-specific access signals, according to various embodiments. In this example, integrated circuit 100 includes a memory 112 (e.g., memory formed back-end-of-the-line BEOL) a logic layer 130 formed (e.g., circuitry fabricated front-end-of-the-line FEOL) on a substrate 135 (e.g., a silicon (Si) wafer or die), an access signal generator 120, and a characteristic adaption circuit 140. Memory 112 includes one or more layers of memory or memory layers 114a to 114f that are formed (e.g., BEOL) above some or all of logic layer 130 (e.g., FEOL CMOS circuitry). In an embodiment, memory 112 may comprise a non-flash rewriteable non-volatile memory. Although memory layers 114a-114f are depicted as being separate from one another for purposes of explanation, memory layers 114a-114f are in contact with one another and are vertically stacked above and in contact with the logic layer 130 (e.g., bottommost memory layer 114f is in contact with upper surface 135 of logic layer 130) to form a unitary whole (e.g., a single die) for an integrated circuit as depicted for integrated circuit 100' as will be described in greater detail below in regards to FIGS. 3 and 6.

A FEOL interlayer interconnect structure (see 255 in FIG. 2) including vias, plugs, contacts, or similar electrically conductive structures (not shown) can be fabricated on top of the active circuitry in logic layer 130 to serve as a foundation upon which the first 114f and subsequent memory layers 114e-114a can be grown along the −FZ axis as part of a BEOL non-volatile memory fabrication process. The interlayer interconnect structure is operative to electrically couple the conductive array lines of the non-volatile cross-point memory arrays in each memory layer with the corresponding active circuitry in the logic layer 130. An upper surface 135s of the interlayer interconnect structure can be considered the 0-point on the Z-axis where FEOL processing ends and BEOL memory layer fabrication begins.

Access signal generator 120 is configured to generate layer-specific signals 118 during an access operation (e.g., a read operation, a programming operation, or an erase operation) to transmit, for example, layer-specific programming voltage values, erase voltage values, read voltage values, read current values, etc., to one layer in layers 114a to 114f. Access signal generator 120 is shown to include a read circuit 122 configured to generate one or more read signals as an access signal during read operations, a programming circuit 124 configured to generate one or more programming signals as an access signal, and an erase circuit 126 configured to generate one or more erase signals as an access signal. Program and erase operations are generally referred to as write operations and read and write operations are types of data operations that can be performed on the one or more memory layers 114a to 114f in memory 112.

In some embodiments, access signal generator 120 and its constituents are configured to generate layer-specific signals 118 having signal characteristics fine-tuned to the layer being accessed. For example, an access signal (i.e., a read signal) during a read operation can have a signal characteristic that is a magnitude characteristic, such as a read voltage level (e.g., 1.0 volts), targeted for a certain layer 114 of memory. As another example, a read signal also can have another signal characteristic that is a timing characteristic, such as a duration (e.g., 50 μS) in which sufficient sensing signals develop at a sense amplifier (not shown) during the read operation. Read circuit 122, programming circuit 124, and erase circuit 126 can generate layer-specific signals 118 having any number or type of signal characteristics that can be adapted and fine-tuned based on the parameters for individual memory layers, according to various embodiments. As used herein, the term "parameter" can refer to a factor that determines a range of variation in the operation of a memory cell. Examples of such parameters include structural attributes or features, such as the size or thickness of a semiconductor material, operational signals (e.g., input voltages, such as Vcc), and the like.

Characteristic adaption circuit 140 is configured to modify a signal characteristic to form a modified signal characteristic with which to access memory 112, and is configured further to adapt an access signal in accordance with the modified signal characteristic that is targeted for a specific layer of memory, such as targeting layer 114*c* instead of layer 114*d*. In some embodiments, characteristic adaption circuit 140 includes a characteristic adjuster 142 that can be configured to adjust the access signal to form an adjusted access signal for individual layers in the multiple layers of memory. Note that an adjusted access signal for a specific layer of memory can be derived independently of the other access signals or other layers of memory. As such, an access signal for one layer of memory (e.g., layer 114*b*) can have a signal characteristic at a first value, and another access signal for another layer (e.g., layer 114*f*) can have second value for the same signal characteristic. In at least some embodiments, characteristic adjuster 142 is further configured to adjust an access signal based on one or more parameters associated with individual layers 114 of memory to form multiple adjusted access signals as layer-specific access signals 118. Therefore, if two or more layers 114*a* to 114*f* of memory are associated with different parameters (e.g., different structural and/or functional attributes), then characteristic adjuster 142 can generate different access signals based on, or as a function of, the different parameters.

In some embodiments, characteristic adjuster 142 includes a repository storing delta values 144 (or otherwise has access to a pool of delta values 144) that are used to adjust the access signals and signal characteristics, where each of the delta values 144 is derived in association with a parameter for a specific layer of memory. A delta value can indicate a value (e.g., a magnitude, a timing value, a descriptive value, such as identifying whether to implement memory cells in a layer as a multi-level cell (MLC) that stores more than one-bit of data (e.g., two-bits as 00, 01, 10, or 11), or a single-level cell (SLC) that stores only one-bit of data (e.g., a single bit as 0 or 1), and the like), whereby the delta value approximates and/or indicates the degree to which a variation in the parameter affects operation of a memory cell, and, in some cases, the degree to which an access signal is to be adjusted to compensate for the effects of the parameter. In some embodiments, a delta value represents an incremental amount to be added or subtracted to an existing value for a signal characteristic, or it can by any value used to modify a value of the existing value for a signal characteristic. Or, a delta value can be an amount that replaces an existing value for a signal characteristic. In some instances, a delta value can be implemented as a layer-specific trim value composed of a number of bits derived from characterizing the effects of a parameter during testing, such as wafer-level testing, or during in-situ characterization. As to the former, an external testing apparatus can determine delta values and program those delta values into integrated circuit 100.

In view of the foregoing, the structures and/or functionalities of integrated circuit 100 can customize signal characteristics for each memory layer 114*a* to 114*f* to compensate for layer-specific variations of parameters, according to various embodiments. Characteristic adjuster 142 can be configured to adjust the access signal to compensate for different parameter values relating to a structure formed in each of the multiple layers of memory. An example of such a structure is a sub-layer of semiconductor material used to form memory cells in the multiple layers of memory 112. A sub-layer in layers 114*a* to 114*f* of memory can be associated with different parameter values. For example, a parameter that can differ over layers 114*a* to 114*f* of memory is a thickness of the sub-layer that can vary due to process variations. For example, a sub-layer composed of a dielectric material can have one thickness at layer 114*f* of memory, but another thickness at layer 114*a* of memory. Unlike single layers of memory formed directly on FEOL substrate 135, each BEOL layer 114*a* to 114*f* is formed at different times during the fabrication of memory 112, and, as such, there may be different variations in process (e.g., different parameters may differ) from one layer to the next. Although the layers 114*a* to 114*f* of memory 112 are depicted as being separate layers for purposes of illustration, the layers 114*a* to 114*f* are in contact with one another, are vertically stacked above one another, are electrically coupled with the circuitry in FEOL logic layer 130, and are in contact with the substrate 135 (e.g., bottom-most layer 114*f* is fabricated first on an upper surface 135*s* of substrate 135). Characteristic adjuster 142, therefore, provides for enhanced controllability of signal characteristics to fine-tune access signals over memory architectures that use a single access signal in a memory operation to access a memory. Enhanced controllability of access signals and signal characteristic, in turn, can give rise to improved memory device yield.

In some embodiments, a repository storing delta values 144 can be disposed in the multiple layers of memory 112, such as repository 116 in BEOL layer 114*e* of memory 112. As repository 116 can be located above logic layer 130, area that otherwise would be consumed by repository 116 in logic layer 130 need not exist. Therefore, the storage of delta values 144 in memory 112 can conserve resources (e.g., silicon area on a die). In at least one embodiment, optional characterizer 146 can be implemented on-chip (e.g., by circuitry in logic layer 130) to determine delta values 144 (or a subset thereof) in-situ. For example, characterizer 146 can characterize the effects of a parameter on multiple layers of memory 112, and can determine (e.g., characterizer 146 can calculate or predict) a delta value 144 in-situ and within integrated circuit 100.

Characteristic adjuster 142 can be configured to determine an access operation in relation to an access to a specific memory layer. Examples of such an access operation include a read operation, a program operation, an erase operation, a block erase operation, a program verify operation, an erase verify operation, among other types of memory operations in which memory cells are accessed. Based on the type of access operation being performed, characteristic adjuster 142 can identify a signal characteristic, such as a programming voltage level, to be adjusted when accessing a memory layer, according to some embodiments. In some cases, characteristic adjuster 142 is configured to modify the signal characteristic as specified by a delta value 144 to form a modified signal characteristic. Further, characteristic adjuster 142 can adapt an access signal in accordance with a modified signal characteristic for a specific memory layer to comply or otherwise operate in a range of desired values. To illustrate, consider that characteristic adjuster 142 determines that a programming operation has been initiated to program memory cells in layer 114c. Character adjuster 142 then selects a delta value, such as 0.5 volts, targeted for layer 114c from a pool of delta values 144, the delta value being derived from a parameter (or a variation thereof) associated with layer 114c. Characteristic adjuster 142 then modifies a signal characteristic, such a programming voltage of 1.75 volts, by adding delta value of 0.5 volts. Thus, the modified signal characteristic is 2.25 volts, which access signal generator 120 generates for transmission to layer 114c to comply with, for example, a specified programming voltage range between 2.15 volts and 2.30 volts.

Figure 2:
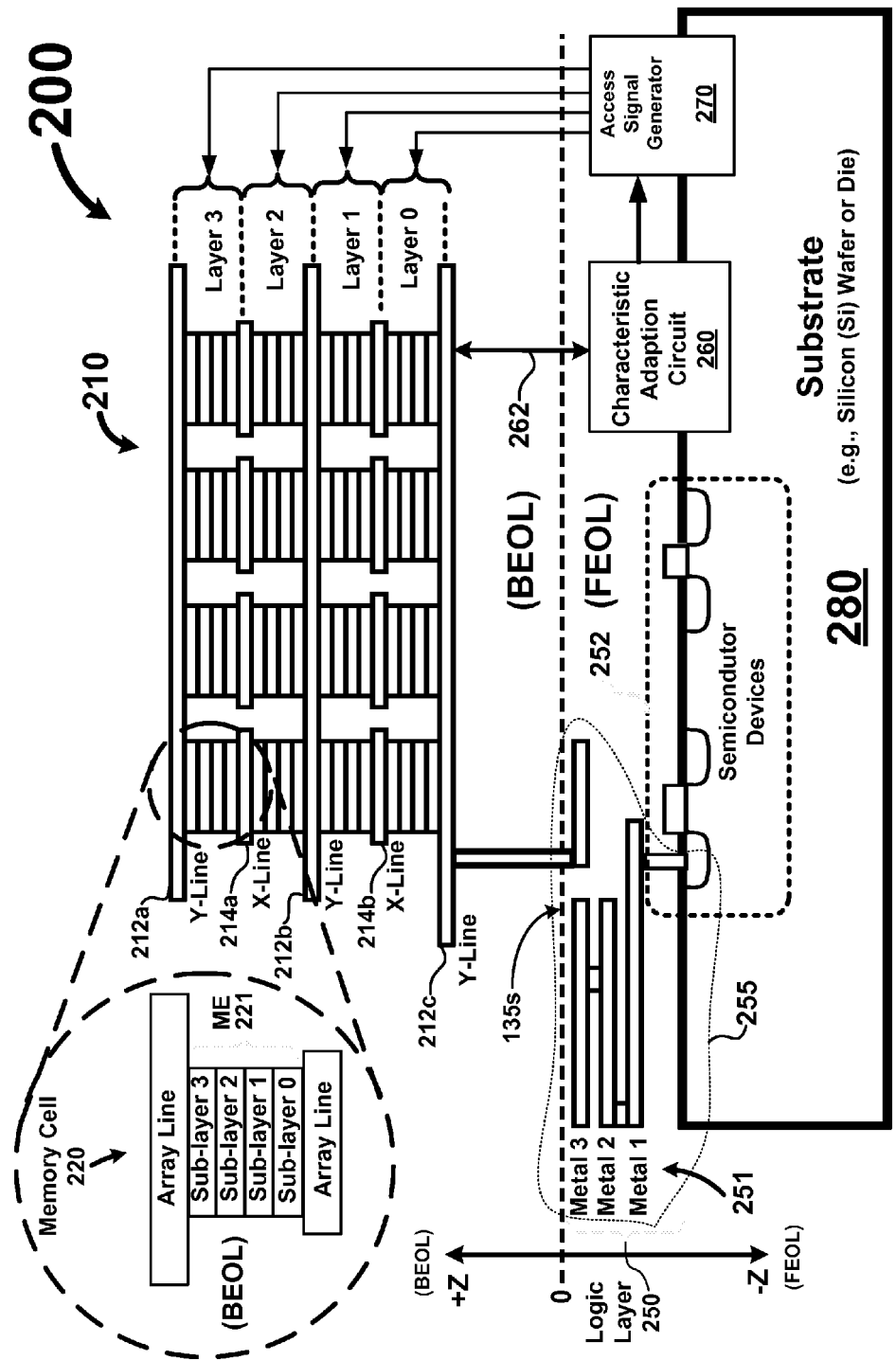
FIG. 2 is a diagram illustrating a specific implementation of a characteristic adjuster in accordance with various embodiments.

FIG. 2 is a diagram depicting a specific implementation of a characteristic adjuster in accordance with various embodiments. Diagram 200 depicts a BEOL memory array 210 disposed over a FEOL logic layer 250, which, in turn, is formed on substrate 280. Logic layer 250 includes a number of semiconductor devices 252 and metal layers 251 and other electrically conductive structures such a vias, plugs, contacts, damascenes, or the like operative as an interlayer interconnect structure 255 (shown in dashed outline), as well as a characteristic adaption circuit 260 and an access signal generator 270. According to various embodiments, portions of either characteristic adaption circuit 260 or an access signal generator 270, or both, can be implemented in FEOL logic layer 250, in BEOL memory array 210, or both. For example, characteristic adaption circuit 260 in FEOL logic layer 250 can include a repository of delta values (not shown) disposed in BEOL array 210 and accessible via path 262. In some embodiments, characteristic adaption circuit 260 and access signal generator 270, or other periphery circuitry, can be formed in logic layer 250 on substrate 280 using complementary metal-oxide-semiconductor ("CMOS") fabrication processes, including relatively low voltage CMOS fabrications processes (e.g., to fabricate low voltage CMOS fabrication devices operable with gate voltages of 1.5 volts or less). One example of a suitable CMOS fabrication technology is 45 nm technology.

In some embodiments, memory array 210 can be structured as a cross point array, with layers of memory (e.g., layers "0" to "3") including memory cells 220 disposed in between X-lines (i.e., row lines) and Y-lines (i.e., bit lines), such as between X-line 214a and Y-line 212a (e.g., layer "3"), between X-line 214a and Y-line 212b (e.g., layer "2"), between Y-line 212b and X-line 214b (e.g., layer "1"), or between X-line 214b and Y-line 212c (e.g., layer "0"). Memory cell 220 can include two terminals (i.e., is a two-terminal memory cell), each terminal being coupled to an array line. Further, memory cell 220 can include a resistive state memory element ("ME") 221 (e.g., a two-terminal memory element). Note that while memory cell 220 can be a two-terminal memory cell, the various embodiments can apply to memory cells having any number of terminals, and, thus, the various embodiments are not limited to resistance-based or CMO-based memory elements or resistance-based memory elements and can be implemented with other memory technologies. While the layers shown can be shown as being parallel to an X-Y plane (i.e., parallel to substrate 280), the layers are not so limited and can be parallel to a Y-Z plane or an X-Z plane.

In some embodiments, memory cell 220 can include a resistive memory element 221, which includes a structure implementing an electrolytic insulator ("EI") as a sub-layer, and a structure based on one or more layers of a conductive oxide material, such as a conductive metal oxide-based ("CMO-based") material as another sub-layer. The conductive metal oxide-based and the electrolytic insulator are in contact with each other and are electrically in series with each other. In various embodiments, the structure can include one or more layers of a conductive oxide material, such as one or more layers of a conductive metal oxide-based ("CMO-based") material, for example. In various embodiments, structure can include but is not limited to a perovskite material selected from one or more the following: $PrCaMnO_x$ (PCMO), $LaNiO_x$ (LNO), $SrRuO_x$ (SRO), $LaSrCrO_x$ (LSCrO), $LaCaMnO_x$ (LCMO), $LaSrCaMnO_x$ (LSCMO), $LaSrMnO_x$ (LSMO), $LaSrCoO_x$ (LSCoO), and $LaSrFeO_x$ (LSFeO), where x is nominally 3 for perovskites or structure can be a conductive binary oxide structure comprised of a binary metal oxide having the form $A_xO_y$, where A represents a metal and O represents oxygen. The conductive binary oxide material may be doped (e.g., with niobium-Nb, fluorine-F, and nitrogen-N) to obtain the desired conductive properties for a CMO. In various embodiments, electrolytic insulator can include but is not limited to a material for implementing a tunnel barrier layer, the material being selected from one or more of the following: high-k dielectric materials, rare earth oxides, rare earth metal oxides, yttria-stabilized zirconium (YSZ), zirconia ($ZrO_x$), yttrium oxide ($YO_x$), erbium oxide ($ErO_x$), gadolinium oxide ($GdO_x$), lanthanum aluminum oxide ($LaAlO_x$), and hafnium oxide ($HfO_x$), and equivalent materials. Typically, the electrolytic insulator comprises a thin-film layer having a thickness of approximately less than 50 Å (e.g., in a range from about 10 Å to about 35 Å). In some embodiments, the sub-layers can include a sub-layer including metal oxide(s) to optionally implement an optional non-ohmic device ("NOD"), and can include sub-layers implemented as, for example, platinum (Pt) electrodes, titanium nitride (TiN) electrodes.

According to an embodiment, sub-layers of memory element 221 are relatively thin layers and, in some cases, are sensitive to process variations. In some examples, the sub-layers of memory element 221 can range in thickness, for example, from 25 Angstrom to 250 Angstrom. During fabrication sub-layers of CMO-based material, electrolytic insulator material (e.g., a tunnel barrier layer) and an optional non-ohmic device (NOD) material are formed at different times and during different processing cycles. As such, these sub-layers may experience one set of process variations when fabricating layer "0," but may experience another set of process variations when fabricating layer "3." Thus, the thicknesses (and/or attributes) of the sub-layers can vary over the multiples layer of memory. Characteristic adaption circuit 260 and access signal generator 270 cooperate to adjust access signals to compensate to the difference process variations that may affect the sub-layers.

Figure 3:
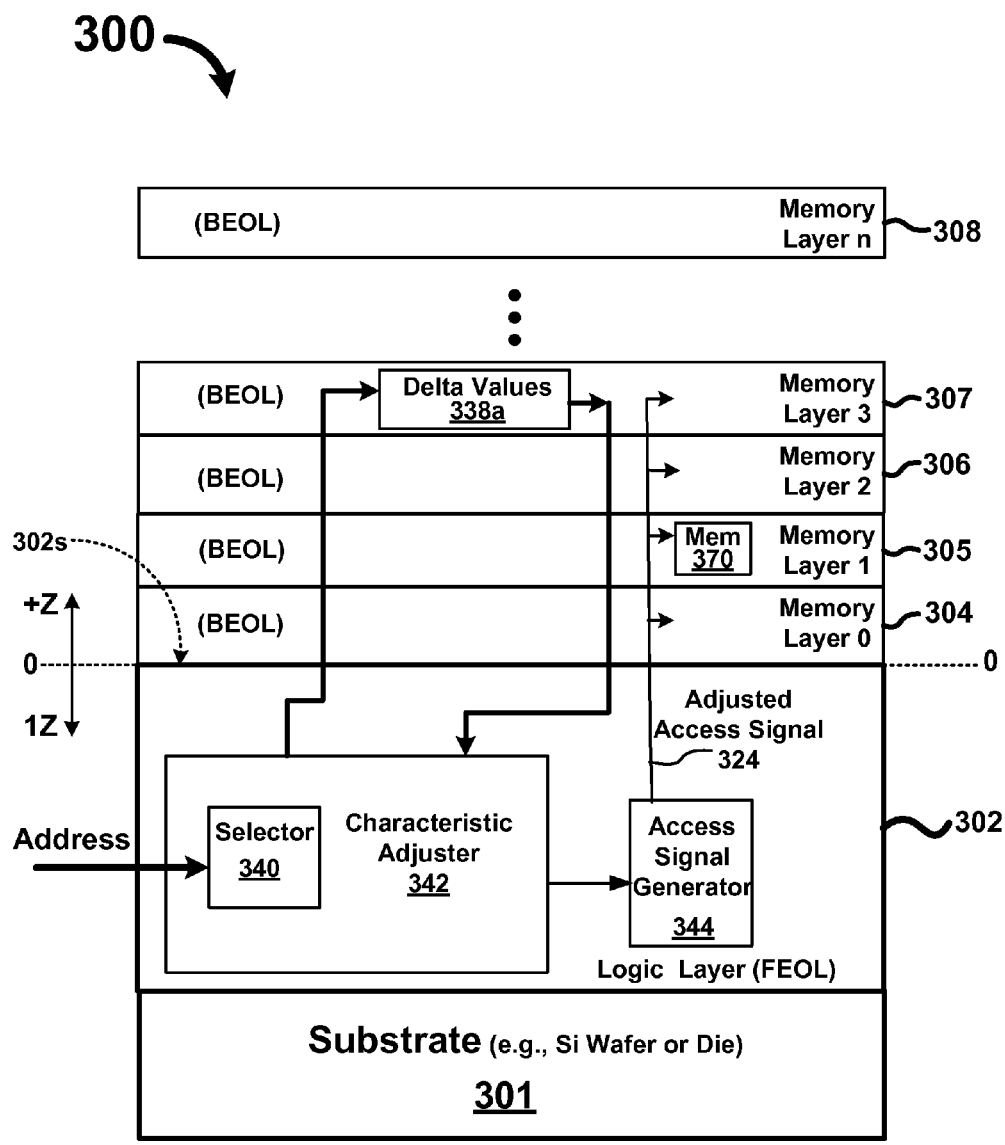
FIG. 3 depicts a cross-section view for an example of an integrated circuit, according to one embodiment.

FIG. 3 depicts a cross-section view for an example of an integrated circuit, according to one embodiment. The cross-section view shows an integrated circuit 300 having multiple BEOL memory layers being vertically disposed above or on a FEOL logic layer 302, which can include logic circuitry for reading data from memory cells as well as programming and erasing logical values in the memory elements. Logic layer 302 and its logic circuitry can be formed upon a semiconductor substrate 301 (e.g., a Silicon—Si wafer or die) The logic circuitry, for example, can include a portion of characteristic adjuster 342 (the other portion optionally residing in layer 307), and an access signal generator 344 configured to compensate for variations in a parameter differently for different BEOL layers 304 to 308 by generating different adjusted access signals via path 324 each targeting one of layers 304 to 308. The portion of characteristic adjuster 342 in the logic layer 302 includes a selector 340 that is configured to select a repository (or a subset of delta values) in one of the BEOL memory layers. Multiple BEOL memory layers can include a first layer 304, a second layer 305, a third layer 306, a fourth layer 307 and an "nth" layer 308 of third dimension memory. One or more layers 304 to 308 can include a portion of characteristic adjuster 342. In this example, the portion of characteristic adjuster 342 in the memory layers includes a repository for storing subsets of delta values 338a.

To illustrate the operation of integration circuit 300, consider that a memory cell is to be accessed during a memory operation, such as a read operation. Selector 340 is configured to decode an address to determine that memory cell ("mem") 370 in memory layer 305 is going to be accessed. Selector 340 can further be configured to select a delta value in BEOL repository including subsets of delta values 338a. The retrieved delta value corresponds to a parameter in memory layer 305 as that is where memory cell 370 resides. Subsequently, characteristic adjuster 342 receives a delta value from the repository, and is configured to adjust an access signal to form a modified access signal. Access signal generator 344 is configured to generate the modified access signal as an adjusted access signal and transmit the adjusted access signal to layer 305 via path 324 to memory cell 370.

Figure 4:
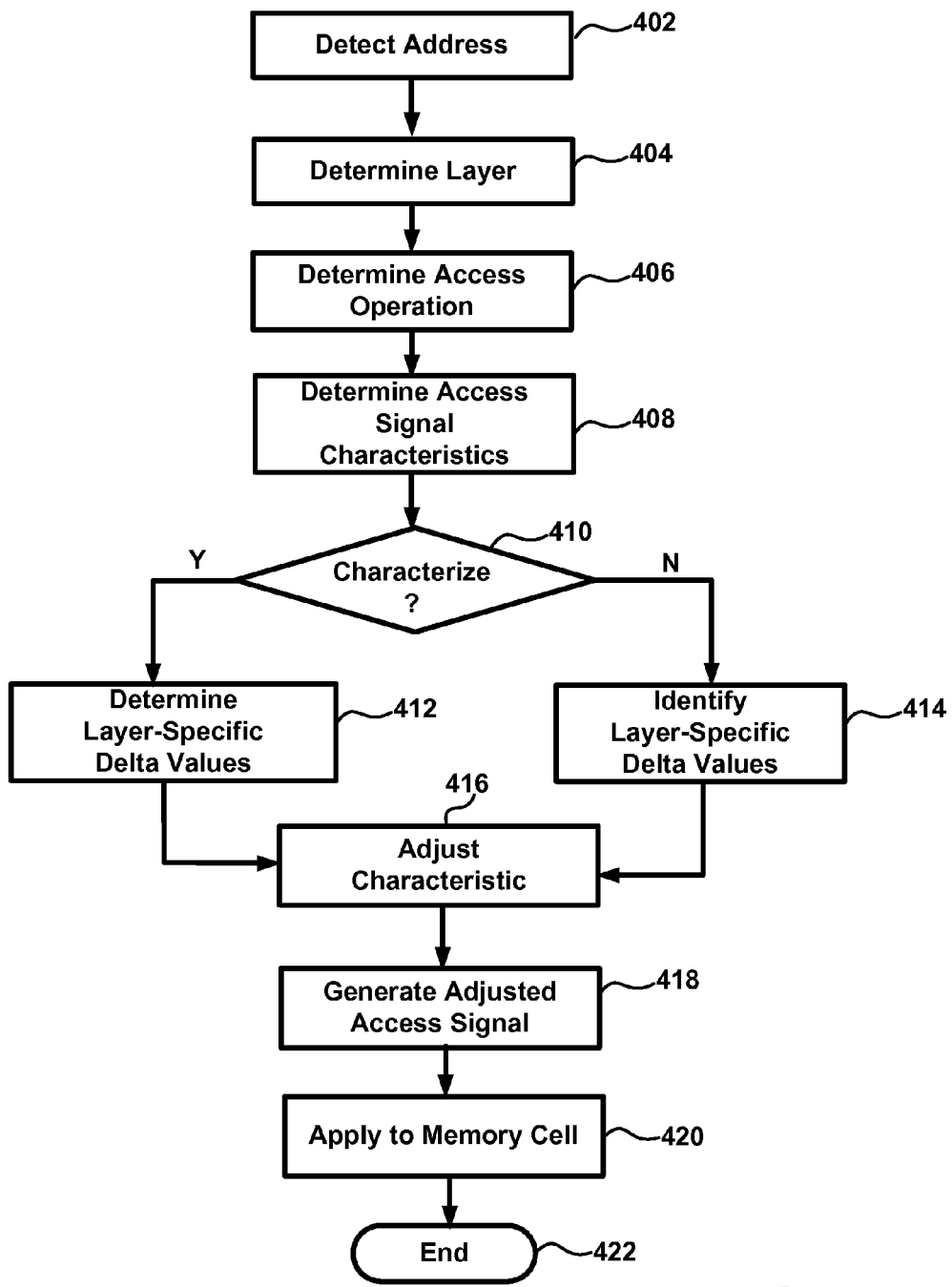
FIG. 4 is a flow diagram depicting an example of a process for adjusting access signals to access multiple layers of memory, according to some embodiments.

FIG. 4 is a flow diagram 400 depicting an example of a process for adjusting access signals to access multiple layers of memory, according to some embodiments. At a stage 402, an address is detected that is associated with an access to one of more memory cells. Based on the address, a layer of memory that is to be accessed is determined at a stage 404. At a stage 406, a determination is made as to the type of access operation that is to be performed to access the addressed memory cells. The access operation can be a read operation, a programming operation, an erase operation, or any other memory-related operation. By determining the type of memory operation, an integrated circuit can reduce the pool of candidate delta values from which a delta value is selected. For example, during a write operation, delta values for an erase operation need not be available. Once the access operation is determined, then one or more signal characteristics can be identified. Optionally, flow 400 includes a stage 410 at which a determination is made whether to characterize a parameter to calculate a layer-specific delta value at a stage 412 or to fetch a layer-specific delta value from a repository at a stage 414. In some embodiments, stage 410 and stage 412 are omitted so that flow 400 passes from stage 408 to stage 414 directly. At a stage 416, flow 400 provides for the adjustment of signal characteristic to obtain a modified signal characteristic using the delta value determined, for example, at a stage 414. Next, an adjusted access signal is generated at a stage 418, and is subsequently applied to a memory cell at a stage 420. Flow 400 terminates at a stage 422.

Figure 5:
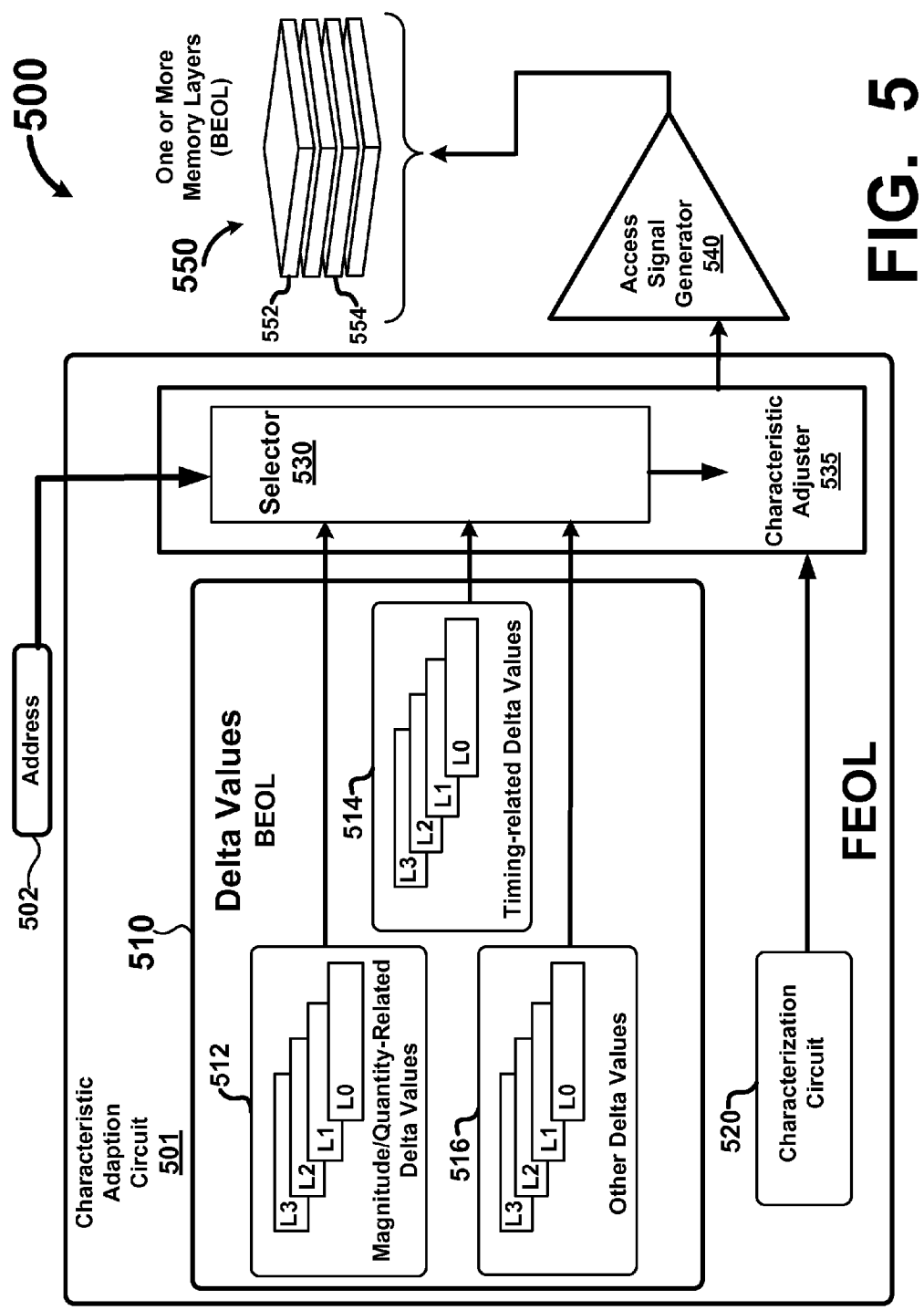
FIG. 5 is a functional block diagram depicting an example of a characteristic adjuster configured to adjust access signals used to access multiple layers of memory, according to some embodiments.

FIG. 5 is a functional block diagram 500 depicting an example of a characteristic adjuster configured to adjust access signals used to access multiple layers of memory, according to some embodiments. Diagram 500 depicts a characteristic adaption circuit 501, an access signal generator 540 and one or more layers of memory 550. Characteristic adaption circuit 501 can include one or more repositories 510 (e.g., BEOL repositories in one or more layers of BEOL memory 550) storing delta values, a characterization circuit 520, and a characteristic adjuster 535. Characteristic adjuster 535 is shown to also include a selector 530 configured to select a delta value from one or more repositories 510 responsive to an address 502.

One or more repositories 510 are shown to include examples of subsets of delta values representative of similar types of delta values for different layers of memory. Subset 512 of delta values includes magnitude and/or quantity-related delta values for different layers (e.g., layers 0 ("L0") to layers 3 ("L3")). Examples of delta values in subset 512 includes delta values representing amounts to modify programming voltage signal levels, erase voltage signal levels, read voltage signal levels, erase verify voltage signal levels, and programming verify voltage signal levels, among others, where the amounts are customized for specific layers of memory. Other examples of delta values in subset 512 include delta values representing quantities, such as a number of bits accessed per programming cycle. To illustrate, consider that memory cells in layer 552 conduct more current than memory cells in layer 554 due to variations in parameters between the two layers. This can be due to, for example, memory cells in layer 552 having thinner tunnel barrier sub-layers than memory cells in layer 554. The number of bits programmed at one time ought to be reduced to decrease the programming current used for programming memory cells 552. Otherwise, the drivers may not be able to deliver sufficient programming current. Therefore, a delta value representing a number of bits (e.g., "8 bits,") for layer 552 is less than a delta value representing a number of bits (e.g., "64 bit") for layer 554. Access signal generator 540 then can generate different programming access signals to access 8 bits and 64 bit when programming memory cells in layers 552 and 554, respectively.

Subset 514 of delta values includes timing-related delta values for different layers (e.g., layers 0 ("L0") to layers 3 ("L3")). Examples of delta values in subset 514 includes delta values representing amounts to adjust a duration of a programming pulse width for programming access signals, amounts to vary read timing (e.g., related to latency), and other amounts relating to time-based or duration-based delta values. Subset 514 of delta values also can include delta values representing a rate of change, such as the rate at which a programming pulse is to rise and fall. Subset 516 of delta values includes other delta values for different layers (e.g., layers 0 ("L0") to layers 3 ("L3")), including descriptive-related data values. Examples of delta values in subset 516 include delta values representing values that indicate descriptive actions to be taken in relation to a specific layer. For example, a delta value in subset 514 can represent an indication to access memory cells in layer 552 as multi-level cells ("MLCs"), whereas another delta value can specify that memory cells in layer 554 is to be accessed as single-level cells ("SLCs"). Further, delta values in subset 514 can represent constants or variables used in algorithms performed by characteristics adjuster 535 to systematically apply access signals differently for various layers of memory.

Figure 6:
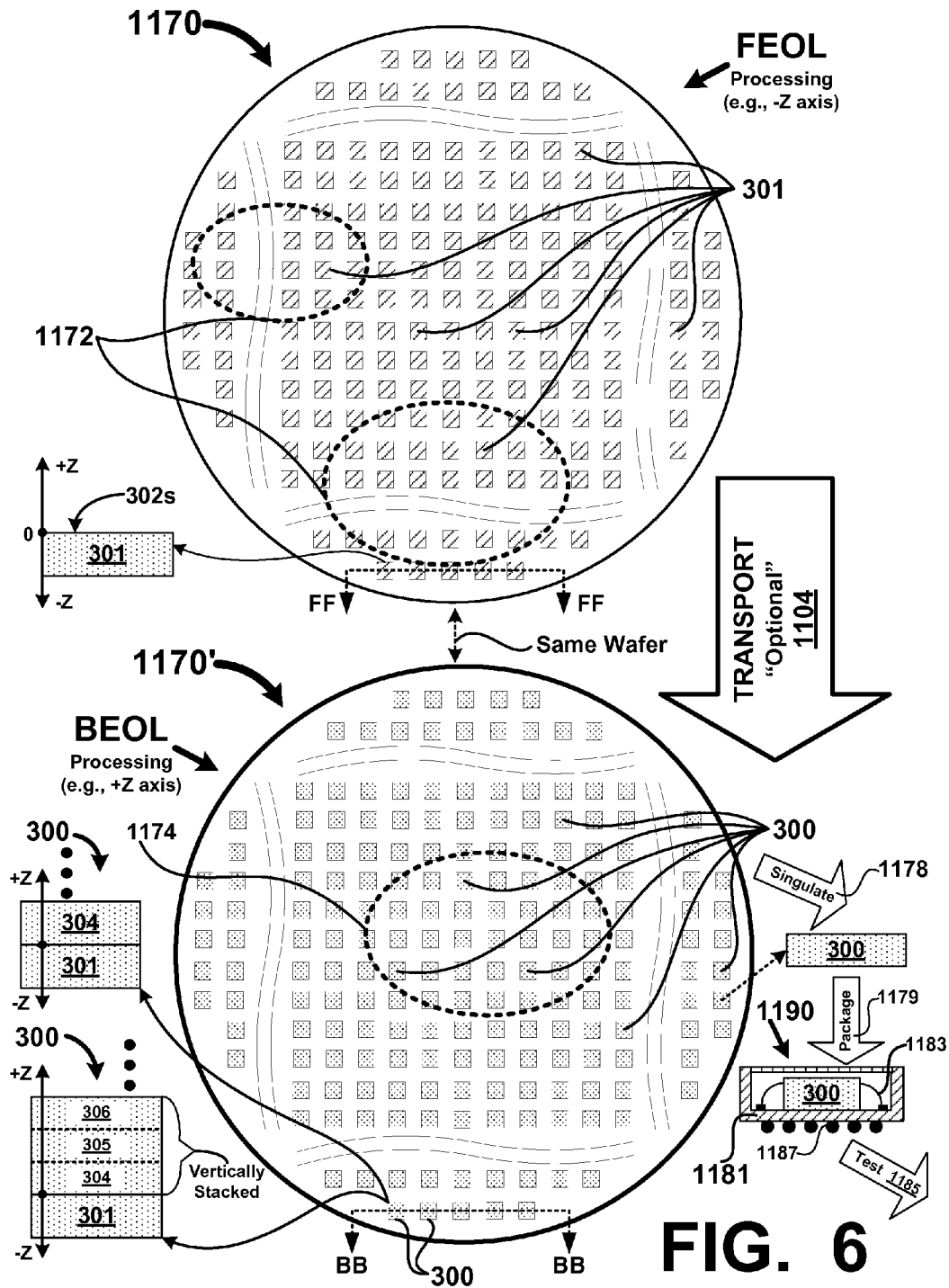
FIG. 6 depicts top plan views of a wafer processed FEOL to form a plurality of base layer die including active circuitry and the same wafer subsequently processed BEOL to form one or more layers of memory directly on top of the base layer die where the finished die can subsequently be singulated, tested, and packaged into integrated circuits.

FIG. 6 is a top plan view depicting a single wafer (denoted as 1170 and 1170') at two different stages of fabrication: FEOL processing on the wafer denoted as 1170 during the FEOL stage of processing where active circuitry in logic layer 302 is fabricated on the substrate 301 (e.g., silicon wafer); followed by BEOL processing on the same wafer denoted as 1170' during the BEOL stage of processing where one or more layers (e.g., 304-308) of non-volatile memory are formed. In an embodiment, one or more layers (e.g., 304-308) may comprise non-flash re-writeable non-volatile memory. Wafer 1170 includes a plurality of the base layer die 301 (see substrate 301 in FIG. 3) formed individually on wafer 1170 as part of the FEOL process. As part of the FEOL processing, the base layer die 301 may be tested 1172 to determine their electrical characteristics, functionality, performance grading, etc. After all FEOL processes have been completed, the wafer 1170 is optionally transported 1104 for subsequent BEOL processing (e.g., adding one or more layers of memory such as single layer 304 or multiple layers 305, . . . 308) directly on top of each base layer die 301. A base layer die 301 is depicted in cross-sectional view along a dashed line FF-FF where the substrate the die 301 is fabricated on (e.g., a silicon Si wafer) and its associated active circuitry in logic layer 302 are positioned along the −Z axis. For example, the one or more layers of memory (e.g., 304-308) are grown directly on top of an upper surface 302s of each base layer die 301 as part of the subsequent BEOL processing. Upper layer 302s can be an upper planar surface of the aforementioned interlayer interconnect structure (see FIG. 2) operative as a foundation for subsequent BEOL fabrication of the memory layers along the +Z axis.

During BEOL processing the wafer 1170 is denoted as wafer 1170', which is the same wafer subjected to additional processing to fabricate the memory layer(s) directly on top of the base layer die 301. Base layer die 301 that failed testing may be identified either visually (e.g., by marking) or electronically (e.g., in a file, database, email, etc.) and communicated to the BEOL fabricator and/or fabrication facility. Similarly, performance graded base layer die 301 (e.g., graded as to frequency of operation) may be identified and communicated to the BEOL fabricator and/or fabrication facility. In some applications the FEOL and BEOL processing can be done by the same fabricator or performed at the same fabrication facility. Accordingly, the transport 1104 may not be necessary and the wafer 1170 can continue to be processed as the wafer 1170'. The BEOL process forms the aforementioned memory layer(s) directly on top of the base layer die 301 to form a finished die 300 (see above reference to die 300 in regards to FIG. 3) that includes the FEOL circuitry portion 301 along the −Z axis and the BEOL memory portion along the +Z axis. A cross-sectional view along a dashed line BB-BB depicts a memory device die 300 with a single layer of memory 304 grown (e.g., fabricated) directly on top of base die 301 along the +Z axis, and alternatively, another memory device die 300 with three vertically stacked layers of memory 304, 305, and 306 grown (e.g., fabricated) directly on top of base die 301 along the +Z. Finished die 300 on wafer 1170' may be tested 1174 and good and/or bad die identified. Subsequently, the wafer 1170' can be singulated 1178 to remove die 300 (e.g., die 300 are precision cut or sawed from wafer 1170') to form individual memory device die 300. The singulated die 300 may subsequently be packaged 1179 to form integrated circuit chip 1190 for mounting to a PC board or the like, as a component in an electrical system (not shown). Die 300 need not be mounted in a package in order to be regarded and an integrated circuit (IC). Here a package 1181 can include an interconnect structure 1187 (e.g., pins, solder balls, or solder bumps) and the die 300 mounted in the package 1181 and electrically coupled 1183 with the interconnect structure 1187 (e.g., using wire bonding). The integrated circuits 1190 (IC 1190 hereinafter) may undergo additional testing 1185 to ensure functionality and yield. The die 300 or the IC 1190 can be used in any system requiring non-volatile memory and can be used to emulate a variety of memory types including but not limited to SRAM, DRAM, and FLASH. Unlike conventional FLASH non-volatile memory, the die 300 and/or the IC's 1190 do not require an erase operation or a block erase operation prior to a write operation so the latency associated with conventional Flash memory erase operations is eliminated and the latency associated with FLASH OS and/or FLASH file system required for managing the erase operation is eliminated. Another application for the IC's 1190 is as a replacement for conventional FLASH-based non-volatile memory in solid state drives (SSD's) or hard disc drives (HDD's).

In at least some of the embodiments of the invention, the structures and/or functions of any of the above-described features and elements can be implemented in software, hardware, firmware, circuitry, a computer readable medium, or a combination thereof. Note that the structures and constituent elements shown in the figures, as well as their functionality, can be aggregated with one or more other structures or elements. Alternatively, the elements and their functionality can be subdivided into constituent sub-elements, if any.

The various embodiments of the invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes can be performed in an arbitrary order, unless otherwise provided in the claims.

The foregoing description, for purposes of explanation, uses specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

The invention claimed is:

1. A circuit, comprising:
   an access signal generator configured to generate a plurality of access signals corresponding to a plurality of layers of a memory device, each of the plurality of layers comprising a corresponding structural or operational parameter and each of the plurality of access signals being configured to access at least one memory cell fabricated on a corresponding layer;
   an access signal adjuster configured to adjust each of the plurality of the access signals with delta values based at least in part on the operational or structural parameter of the corresponding layer; and
   a data repository fabricated on at least one of the plurality of layers of the memory device and configured to store the delta values.

2. The circuit of claim 1,
   wherein the access signal generator and the access signal adjuster are fabricated front-end-of-line (FEOL) on a semiconductor substrate; and
   wherein the plurality of layers of the memory device are fabricated back-end-of-the-line (BEOL) directly above the semiconductor substrate.

3. The circuit of claim 1,
   wherein a plurality of memory cells are fabricated in memory arrays in each of the plurality of layers of the memory device; and
   wherein each of the plurality of memory cells comprise a two-terminal re-writable non-volatile memory element.

4. The circuit of claim 1,
wherein the access signal is configured to enable access to the at least one memory cell during a read operation, a programming operation, or an erase operation.

5. The circuit of claim 1,
wherein the access signal is configured to provide a layer-specific read voltage, programming voltage, erase voltage, or read current to a specific layer of the plurality of layers of the memory device.

6. The circuit of claim 1,
wherein the access signal adjuster is configured to adjust a magnitude or a timing of the access signal.

7. The circuit of claim 1,
wherein the delta values comprise:
   a programming voltage and an erase voltage corresponding to each of the plurality of layers of the memory device;
   a read latency and a read pulse duration corresponding to each of the plurality of layers of the memory device; and
   a verification voltage and an erase verification voltage corresponding to each of the plurality of layers of the memory device.

8. The circuit of claim 1,
wherein the access signal generator is configured to adjust the access signal based on a thickness of the corresponding layer upon which the at least one memory cell is fabricated.

9. A circuit, comprising:
an access signal generator configured to generate an access signal to enable access to a memory cell fabricated on a predetermined layer of multiple stacked layers of a memory device;
an access signal adjuster configured to adjust the access signal based at least in part on a parameter associated with the predetermined layer; and
a data repository fabricated on at least one of the multiple stacked layers of the memory device and configured to store delta values corresponding to each of the multiple stacked layers of the memory device.

10. The circuit of claim 9,
wherein the delta values comprise:
   a programming voltage and an erase voltage corresponding to each of the multiple stacked layers of the memory device;
   a read latency and a read pulse duration corresponding to each of the multiple stacked layers of the memory device; and
   a verification voltage and an erase verification voltage corresponding to each of the multiple stacked layers of the memory device.

11. The circuit of claim 10, further comprising:
a selector configured to detect access to the predetermined layer and to select a delta value corresponding to the predetermined layer in response to detecting access to the predetermined layer.

12. A memory device, comprising:
semiconductor substrate;
a front-end-of-the-line (FEOL) logic layer fabricated on the semiconductor substrate;
a plurality of layers of back-end-of-the-line (BEOL) memory fabricated directly above the semiconductor substrate;
a memory array embedded in each layer of the BEOL memory comprising a plurality of two-terminal re-writable non-volatile memory elements; and
a data repository fabricated on at least one of the layers of BEOL memory and configured to store delta values corresponding to parameters associated with each of the layers of BEOL memory;
wherein the FEOL logic layer comprises:
   an access signal generating circuit configured to generate an access signal to enable access to a predetermined memory element fabricated on a predetermined layer of the BEOL memory; and
   an access signal adjusting circuit configured to adjust the access signal based at least in part on a delta value of the parameter corresponding to the predetermined layer.

13. The memory device of claim 12,
wherein the access signal is configured to enable access to the predetermined memory element during a read operation, a programming operation, or an erase operation.

14. The memory device of claim 12,
wherein the access signal is configured to provide a layer-specific read voltage, programming voltage, erase voltage, or read current to the predetermined layer to access the predetermined memory element.

15. The memory device of claim 12,
wherein the access signal adjusting circuit is configured to adjust a magnitude or a timing of the access signal.

16. The memory device of claim 12,
wherein the parameter comprises structural or operational attributes corresponding to each of the layers of the BEOL memory.

17. The memory device of claim 12,
wherein the delta values comprise:
   at least two different programming voltage values and at least two different erase voltage values corresponding to two different layers of the BEOL memory;
   at least two different read latency durations and at least two read pulse durations corresponding to two different layers of the BEOL memory; or
   at least two different programming verification voltage values and at least two different erase verification voltage values corresponding to two different layers of the BEOL memory.

18. The memory device of claim 17,
wherein the FEOL logic layer further comprises:
   a selecting circuit configured to detect access to the predetermined layer and to select a delta value based on the predetermined layer.

19. The memory device of claim 12,
wherein the access signal adjusting circuit is configured to adjust the access signal based on a thickness of the predetermined layer.

* * * * *